(12) United States Patent
Boernert et al.

(10) Patent No.: US 6,317,619 B1
(45) Date of Patent: Nov. 13, 2001

(54) APPARATUS, METHODS, AND DEVICES FOR MAGNETIC RESONANCE IMAGING CONTROLLED BY THE POSITION OF A MOVEABLE RF COIL

(75) Inventors: Peter Boernert; Tobias Richard Schaeffter; Steffen Weiss, all of Hamburg (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/363,349

(22) Filed: Jul. 29, 1999

(51) Int. Cl.[7] ................................................ A61B 5/055
(52) U.S. Cl. .................... 600/410; 600/422; 324/307; 324/309; 324/318
(58) Field of Search .................... 600/410, 422, 600/423; 324/307, 309, 318, 322

(56) References Cited

U.S. PATENT DOCUMENTS

| | | |
|---|---|---|
| 5,184,074 | 2/1993 | Kaufman et al. . |
| 5,390,673 | 2/1995 | Kikinis ............................... 128/653.2 |
| 5,545,993 | 8/1996 | Taguchi et al. ....................... 324/309 |
| 5,715,822 * | 2/1998 | Watkins et al. ....................... 600/422 |
| 5,800,352 | 9/1998 | Ferre et al. ........................... 600/407 |
| 5,830,142 * | 11/1998 | Kuhara ................................. 600/410 |
| 6,011,396 * | 1/2000 | Eckels et al. ......................... 324/307 |

OTHER PUBLICATIONS

"Integrated and Interactive Position Tracking and Imaging of Interventional Tools and Internal Devices Using Small Fiducial Receiver Coils" by Glyn A. Coutts et al., in MRM 40: pp. 908–913, 1988.

* cited by examiner

Primary Examiner—Ruth S. Smith
(74) Attorney, Agent, or Firm—John F. Vodopia

(57) ABSTRACT

Objects of this invention include provision of magnetic resonance (MR) imaging methods, MR apparatus, and radio-frequency (RF) receiving coil devices permitting interactive MR examination of a patient. In particular, this invention includes means for generating MR images by a moveable RF coil which can be moved across a patient during an MR examination. The MR apparatus includes a position detection system which detects the current position and orientation of the moveable RF coil. The coil can be hand held for manual movement or can be attached to mechanical manipulators for controlled movement. The imaging methods determine and generate magnetic gradient and RF pulse sequences to excite nuclear magnetization in a 3D region determined with respect to the current 3D position and 3D orientation of the moveable RF coil. The invention also includes moveable RF coils for receiving and transmitting which are configured and sized for convenient manipulation by an operator. A preferable moveable RF coil assembly includes markers necessary to interact with a particular position detection system, display means for displaying reconstructed images in real-time, and control means for operator entry of signals controlling the MR apparatus. This invention also includes a carrier medium with recorded program instructions for controlling a programmable MR apparatus to perform the disclosed methods.

16 Claims, 5 Drawing Sheets under the invention, upon selection by the user. These methods further include, upon movement of the coil into an initial rough position for examining a selected region, using a relatively rapid MR sequence for locating the selected region in view of the coil's position and orientation. Upon further coil movement to a final precise position for final imaging, these methods include using a relatively slower MR sequence optimized to the type of final images desired.

APPARATUS, METHODS, AND DEVICES FOR MAGNETIC RESONANCE IMAGING CONTROLLED BY THE POSITION OF A MOVEABLE RF COIL

BACKGROUND OF THE INVENTION

1. Field of the Invention

The present invention relates to magnetic resonance (MR) apparatus and methods for reconstructing images from signals received by a moveable RF coil assembly, the current three-dimensional (3D) position and 3D orientation of which guides the location of the nuclear magnetization excited during the imaging process, and also relates to a RF coil assembly for receiving and transmitting capable of being moved across a patient while guiding the location of the MR imaging.

2. Description of the Related Art

Conventional magnetic resonance (MR) is based on batch acquisition and retrospective image reconstruction and patient diagnosis. In such conventional MR imaging, during a preparation phase, the patient along with necessary RF receiving coils are arranged in an examination zone. During actual MR measurement, which typically requires a comparatively long time, usually a large volume, either multiple 2-D slices or one 3-D image, within the sensitivity range of the receiving coil is measured. Patient diagnosis can be made only after collection of a complete set of MR data and its reconstruction into a diagnostic image. If the region of interest in the patient turns out to be situated outside the planned examination zone or of the sensitivity range of the receiving coil, the patient and the receiving coil have to be repositioned, and the entire measurement repeated.

In contrast, a different and interactive way of imaging is known from ultrasound imaging. There, the position and orientation of the ultrasound probe necessarily determines the imaging plane, and ultrasound images are displayed in rapid succession, even in real time, as they are received by the probe. Accordingly, the ultrasound imaging plane can be interactively determined by manipulation of the ultrasound probe in order to obtain at once images of greatest clinical usefulness.

In recent years several developments have occurred which have begun to alleviate some problems previously associated with MR imaging. First, an almost real-time capability has been developed, because the speed with which MR images can be acquired has been significantly reduced by means of improved magnetic gradient field systems and of new imaging procedures. Second, new main-field magnet designs have been developed which allow for significantly improved patient access in comparison to prior tunnel-shaped MR systems. Finally, noteworthy developments in other fields, such as the field of image-guided surgery, include position detection systems capable of accurate guidance of instruments during critical surgical procedures, and position detection systems capable of accurate positioning of catheters in a patient.

What remains lacking, however, in the current state of the MR arts is apparatus and methods which provide for interactive MR examination having the known flexibility of ultrasound methods.

Citation of a reference herein, or throughout this specification, is not to be construed as an admission that such reference is prior art to the Applicant's invention of the invention subsequently claimed.

SUMMARY OF THE INVENTION

The objects of the present invention are to provide methods, apparatus, and devices which overcome the above identified problems in the current state of the art, namely which provide for an interactive way for an operator to work with an MR apparatus.

It is a general object of the present invention to provide MR methods and apparatus according to which a moveable RF coil defines the 3D position and 3D orientation of the region to be imaged. The provided methods are implemented on an apparatus having a position detection system, and use the 3D position and 3D orientation of the moveable RF coil to determine parameters of the MR measurement sequence so that the region imaged is situated within the sensitivity volume of the moveable RF coil. Alternatively, the region imaged is determined simply relative to the 3D position and 3D orientation of the moveable RF coil, although not necessarily within the sensitivity volume of the coil. In either case, the moveable RF coil can then be arbitrarily moved across the examination zone while the region imaged follows automatically and interactively.

It is a particular object of the present invention to provide a moveable RF coil assembly that provides for imaging regions of interest of a patient that are defined interactively. The RF coil assembly includes a combination of a surface RF coil for receiving and transmitting and means to interact with a position detection system. The RF surface coil transmits RF pulses exciting nuclear magnetization in a nearby part of a patient and receives MR imaging signals thereby generated.

The position detection system determines the 3D position and 3D orientation of the moveable RF surface coil in order that nuclear magnetization can be excited within the sensitivity range of, or at least be determined by, the RF coil. The present invention is adaptable to many alternative position detection systems, such as optically-based systems, ultrasound based systems, systems using MR-active microcoils, systems dynamically locating the sensitivity profile of the RF coil, systems based on image registration, and so forth.

In preferred embodiments, the moveable RF coil assembly also includes operator assistance features, such as an LCD display for MR images or other operator information mounted in its proximity, for example on a handle of the coil assembly, means for the operator to conveniently input control parameters to the MR apparatus, an additional user interface, and so forth.

It is a further particular object of the present invention to provide an MR apparatus advantageously useable with such a moveable RF coil assembly. Preferably, such an MR apparatus includes a more open magnet configuration, a position detection system, and a control means for determining gradient field and RF pulse sequence parameters in view of the determined 3D position and 3D orientation of the moveable RF coil assembly, so that the regions of the patient indicated by the coil assembly are imaged. Such an MR apparatus permits the operator to move the RF coil assembly arbitrarily across the patient while the position detection system automatically tracks the coil and the MR imaging is controlled accordingly. A region of interest can thus be interactively defined and imaged.

It is an additional particular object of the present invention to provide methods for using such an MR apparatus and moveable RF coil assembly. These methods include determining the 3D position and 3D orientation of the moveable RF coil from data returned by the position detection system, and the subsequent use of the determined 3D position and 3D orientation to select parameters of the applied MR sequence. These methods apply different, preferably high-speed, imaging sequences, appropriate in these circumstances, and reconstruct MR images from received signals in a conventional manner. For example, individual and multiple slices at various 3D positions and 3D orientations with respect to the current 3D position and 3D orientation of the moveable RF coil assembly can be imaged by high-speed spin-echo protocols, for example the RARE sequence, or high-speed gradient echo protocols, for example the EPI sequence. Also, linear images can be obtained by two-dimensional excitation sequences, and can then be displayed in a manner similar to the M-mode or B-mode displays known from ultrasound imaging. Reduced field of view excitation sequences can be used to provide more rapid acquisition with reduced aliasing problems.

It is yet an additional particular object of the present invention to provide a carrier medium with program instructions for causing a programmable control means of an MR apparatus to control the MR apparatus to function according to the methods described herein.

In detail, these objects are by the following specific embodiments of this invention. In a first embodiment, this invention includes a method for generating magnetic resonance (MR) images by an MR apparatus comprising: positioning a moveable radio-frequency (RF) coil holder in proximity to an object to be examined, determining a current 3D position and a current 3D orientation of the moveable RF coil holder, determining magnetic field gradient pulses and RF pulses for exciting nuclear magnetization in a region of interest with a 3D position and a 3D orientation located relative to the current 3D position and the current 3D orientation of the moveable RF coil holder, applying the determined magnetic field gradient pulses and RF pulses in order to excite nuclear magnetization in the determined region of interest, receiving RF imaging signals that are generated by the excited nuclear magnetization by an RF coil in the moveable RF coil holder, and reconstructing an MR image of the region of interest from the received RF imaging signals.

In various aspects, the first embodiment also includes: that the step of determining a current 3D position and current 3D orientation further comprises determining the spatial coordinates of three non-collinear markers on the moveable RF coil holder; a step of displaying the reconstructed MR image on a display in proximity to the moveable RF coil holder; that the determined RF pulses are transmitted by an RF coil in the RF coil holder; that the step of determining magnetic gradient field and RF pulses is responsive to a current position of the region of sensitivity of the RF coil in the RF coil holder, the current position of the region of sensitivity depending on the reference sensitivity profile of the RF coil and on the current 3D position and current 3D orientation of the moveable RF coil holder; that the RF coil holder comprises control means for the entry of parameters, and that the step of determining magnetic gradient field and RF pulses is responsive to the parameters entered by the control means; repetitively executing the steps of positioning, determining a position and an orientation, determining magnetic field and RF pulses, applying, receiving, and reconstructing in order to generate a plurality of MR images from a plurality of regions of interest; after the step of determining the current 3D position and current 3D orientation of the RF coil holder, a step of moving the object so that a part of the object in proximity to the moveable RF coil holder is positioned in a homogeneity volume of a main magnetic field of the MR apparatus; that the moveable RF coil assembly is hand held, and that the RF coil assembly is manually positioned by an operator in proximity to the object; that the moveable RF coil assembly is coupled to a mechanical manipulator, and that the mechanical manipulator is controlled by the operator to position the moveable RF coil holder in proximity to the object; that the nuclear magnetization is excited in a cylinder with a longitudinal axis substantially perpendicular to a plane of the RF receiving coil holder, and that a one-dimensional MR image of the cylinder is reconstructed; and that the nuclear magnetization is excited in a slice with a adjustable position and orientation with respect to the current 3D position and current 3D orientation of the moveable RF receiving coil holder, and that a two-dimensional image of the region of the slice is reconstructed.

In a second embodiment, this invention includes an MR system for generating magnetic resonance (MR) images of a region of interest of an object to be examined comprising: a main field magnet for generating a steady magnetic field in the region of interest, a magnetic field gradient system for generating temporary gradients in the steady magnetic field in the region of interest, a radio-frequency (RF) transmitter system for transmitting RF pulses to the region of interest, a moveable RF receiving coil assembly that includes (i) a moveable RF coil holder including an RF receiving coil for receiving RF imaging signals for reconstructing an MR image, (ii) means for providing position signals representative of a 3D position and a 3D orientation of the RF coil holder, (iii) means for displaying to the operator reconstructed MR images, and (iv) means for manipulating the moveable RF coil holder and the means for displaying, a position detection system for detecting the position signals, an RF receiver for receiving RF imaging signals from the RF receiver coil, control means responsive to the detected position signals for (i) controlling the position detection system to determine the current 3D position and the current 3D orientation of the moveable RF receiving coil holder, (ii) determining magnetic field gradient pulses and RF pulses for exciting nuclear magnetization in a region determined with respect to the current 3D position and the current 3D orientation of the moveable RF receiving coil holder, (iii) controlling the magnetic field gradient system and the RF transmitter system to apply the determined magnetic field gradient pulses and RF pulses in order to excite nuclear magnetization in the determined region, (iv) controlling the RF receiver to receive RF imaging signals generated by the excited nuclear magnetization, and (v) reconstructing an MR image of the region of interest from received MR imaging signals.

In various aspects, the second embodiment further includes: that the control means further comprises memory means and processing means, and that the processing means are responsive to one or more programs resident in the memory means in order to perform the controlling; that the moveable RF coil holder further includes an RF coil for transmitting RF pulses; that the moveable RF coil assembly further comprises entry means for operator entry of parameters, and that the determining by the control means of magnetic gradient field and RF pulses is responsive to the parameters entered by control means; and a positioning system for positioning the object to be examined with respect to the main field magnet, and that the control means is further for controlling the positioning means so that a part of the object in proximity to the determined 3D position and 3D orientation of the moveable RF receiving coil holder is in a homogeneity volume of the main field magnet.

In a third embodiment, this invention includes a moveable radio-frequency (RF) coil assembly for use by an operator of a magnetic resonance (MR) imaging apparatus to acquire signals for dynamically reconstructing MR images of an object to be examined comprising: a moveable RF coil holder including an RF receiving coil for receiving RF imaging signals for reconstructing an MR image, means for providing position signals representative of a 3D position and a 3D orientation of the RF coil holder, means for displaying to the operator reconstructed MR images, and means for manipulating the moveable RF coil holder and the means for displaying.

In various aspects, the third embodiment further includes: entry means for operator entry of parameters to which the MR apparatus is responsive; that the moveable RF coil holder also includes an RF transmitting coil for transmitting RF signals to the object to be examined; that the position signals are representative of the spatial coordinates of three non-collinear points on the moveable RF coil holder; that the means for displaying comprises a display mounted integrally with the RF coil assembly; that the means for displaying comprises a head-mounted display for mounting on the operator's head; that the means for manipulating are configured and sized to be hand held by the operator; and that the means for manipulating are adapted for coupling to a mechanical manipulator.

In another embodiment, this invention includes a computer readable media encoded with program instructions for causing a programmable control means of an MR apparatus to perform the method of claim 1.

BRIEF DESCRIPTION OF THE DRAWING

Other objects, features and advantages of the present invention will become apparent upon study of the following detailed description when taken in conjunction with the appended drawing, wherein.

DETAILED DESCRIPTION OF THE INVENTION

Figure 1:
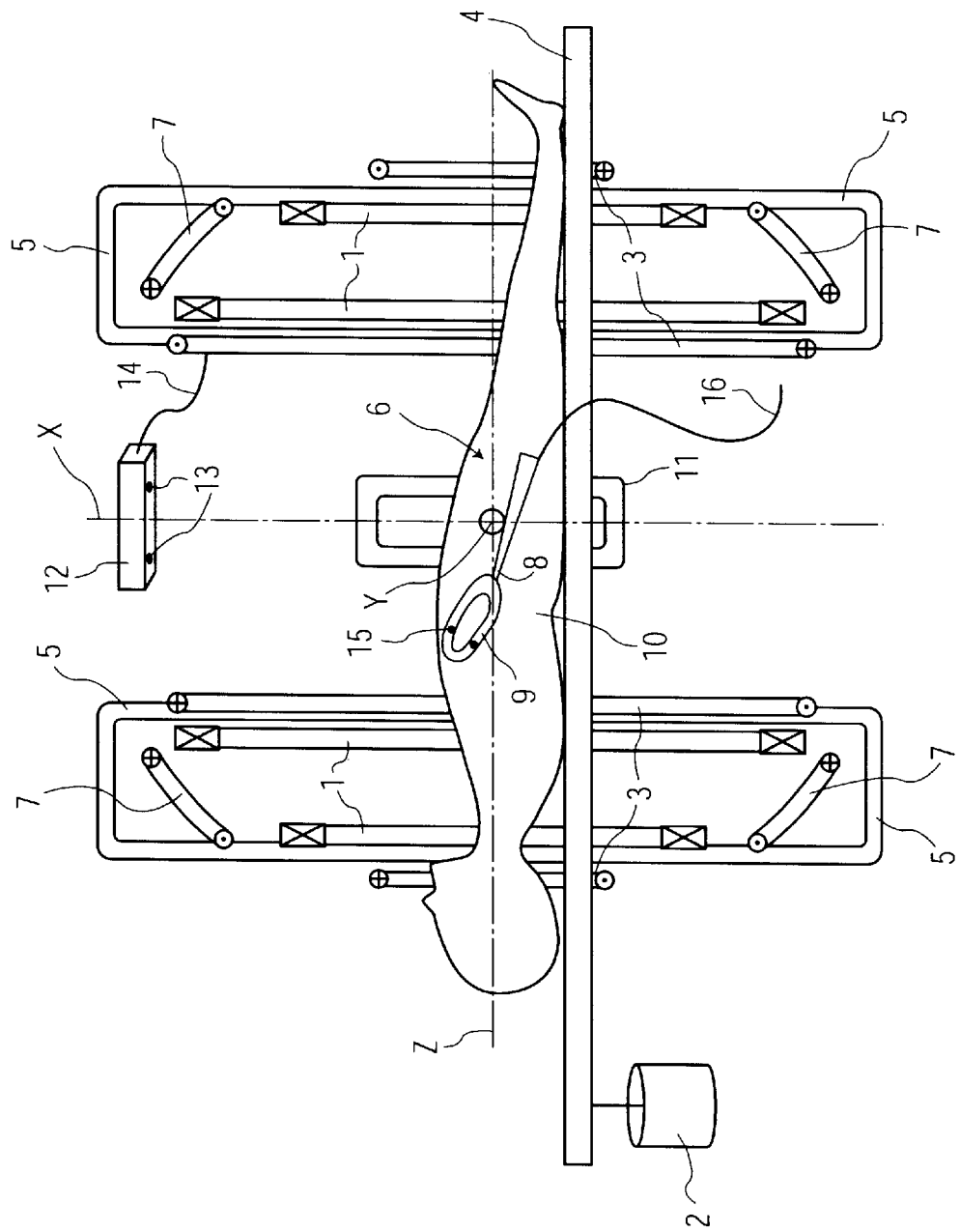
FIG. 1 illustrates an exemplary embodiment of the present invention.

In the following, various embodiments of the apparatus, methods, and devices of the present invention are described with reference to the figures of the drawing. In certain figures, the current invention is described as being utilized along with a particular, but exemplary, MR system. In view of the subsequent description, it will be readily apparent to one of ordinary skill how to adapt and use the present invention along with MR apparatus of the other physical and functional designs known in the art.

As used herein, a 3D position refers to a position determined by three spatial coordinates, for example, three Cartesian coordinates with respect to a coordinate system fixed in an MR apparatus. Also as used herein, a 3D orientation refers to an angular position determined by three angles, for example, the Euler angles defining the orientation with respect to the MR apparatus coordinate system.

MR Apparatus According to the Present Invention

Turning first to FIG. 1, illustrated therein, in partial cross-section, is the physical structure of an exemplary MR apparatus to which the present invention is advantageously adaptable. The illustrated MR apparatus includes a main field magnet including a system of four coils 1 for generating a uniform, steady magnetic field within a homogeneity volume and the strength of which can be in the range of from some tenths of a Tesla (T) up to 2 T or more. These coils are situated concentrically with respect to the Z-axis. Within the homogeneity volume, the steady magnetic field is sufficiently homogeneous for satisfactory MR imaging.

The illustrated main field magnet is in a so-called "double-doughnut" configuration in order to provide operator access to the patient so that moveable RF coil assembly 6 of the present invention is easily moveable by the operator in or over at least a portion of patient 10. Main-field magnets having such an "open" configuration are highly preferable.

The exemplary MR apparatus includes a magnetic field gradient system for generating gradients in the Z-component of the magnetic field along the three coordinate axes. Four coils 3, concentrically situated with respect to the Z-axis, generate a magnetic gradient field extending along the Z-axis and varying linearly in this direction. Four coils 7 generate a magnetic gradient field also extending along the Z-axis but varying linearly along the X-axis (vertically). Finally, a magnetic gradient field also extending along the Z-axis but varying linearly along the Y-axis (perpendicular to the plane of drawing of FIG. 1) is generated by four coils 5 (only two of which are illustrated), which may be identical to the coils 7 but arranged to be offset 90° in space with respect thereto. Preferably, the fields generated by coils 3, 5, and 7 vanish at the coordinate origin so that the field strength there is determined exclusively by the steady uniform magnetic field of main field coil system 1.

The exemplary MR apparatus further includes stationary coil systems for transmitting RF pulses to an object to be examined in order to excite nuclear magnetization therein, and for receiving RF signals from the excited nuclear magnetization. Either a single coil system can be used for receiving and for transmitting, as illustrated by coil 11 in FIG. 1, or separate stationary transmitting coils and receiving coils can be provided.

FIG. 1 also illustrates an object to be examined, for example patient 10, positioned within the coils of the main-field and gradient-system magnets. Patient 10 is arranged on table top 4, which can be displaced longitudinally through the MR apparatus by a patient positioning system including controllable motor 2 and associated drive components. By such longitudinal displacement a region of interest in the patient can be best positioned within the homogeneity volume of the main-field magnet.

According to the present invention, the object to be examined, for example patient 10, is examined in particular detail and in an interactive manner by means of the moveable RF coil assembly of this invention. Illustrated moveable RF coil assembly 6 is adapted to be hand held for manual manipulation and movement by an operator (not illustrated), such as a medical staff person. In other embodiments, the moveable RF coil assembly can manipulated and moved by a surgical manipulator (not illustrated) to which it is coupled, or can be manipulated and moved by a robot manipulator, such as a robot arm (not illustrated). However manipulated, the 3D position and 3D orientation of the RF coil assembly guides the 3D position and 3D orientation of the nuclear magnetization excited, and thereby also guides the location of the region imaged. Regions of most interest in patient 10 can be imaged with highest resolution by simply moving the RF coil assembly in proximity.

The moveable RF coil assembly of the present invention, which is described in greater detail subsequently, generally includes, as illustrated in FIG. 1, at least manipulation means for grasping, manipulation, and movement, such as handle 8 for manual manipulation, a coil holder containing an RF coil of a shape and size adapted to the current examination, such as coil generally planar holder 9, and a cable adapted to conduct signals between the coil assembly and the MR apparatus through the MR environment (which has high and time-variable magnetic fields), such as cable 16. The moveable RF coil is also preferably shaped to conform to the portion of the patient to be examined and is sized appropriately to transmit to and to receive signals from a depth where anatomic regions of interest are located.

Importantly, according to this invention, the moveable RF coil assembly cooperates with a position detection system to generate signals representative of the current instantaneous 3D position and 3D orientation of the moveable RF coil. The present invention is adaptable to any position detection system that can function in the MR environment to repetitively generate accurate position signals. An optically-based position detection system capable of continuously generating accurate position signals is known from, e.g., U.S. Pat. No. 5,817,105 and U.S. applications Ser. Nos. 08/739,763 and 08/981,017 (both allowed).

Illustrated in FIG. 1 is an exemplary optically-based position detection system including optical markers 15, which are placed on the moveable RF coil assembly and are capable of generating a clearly detectable optically signature, and camera unit 12, which is placed to receive stereoscopic views of the homogeneity volume. Preferably, at least three optical markers 15, such as LEDs having characteristic emissions, such as infrared, are placed on the moveable RF coil holder, or generally on the moveable RF coil assembly, in a non-collinear arrangement. Preferably, camera unit 12 includes at least two spaced-apart cameras 13, for example CCD cameras, focused throughout the homogeneity volume for receiving images of optical markers 15. Cable 14 connects the camera unit to processing units in the MR apparatus which determine the 3D spatial coordinate positions of the optical markers from the camera images. By routine methods, first, the three spatial coordinates of an optically detectable marker can be determined from a pair of stereoscopic images, and, second, from the 3D coordinates of three non-collinear markers, the 3D position and 3D orientation of generally planar RF coil holder 9 of coil assembly 6 can be also routinely determined.

Figure 2:
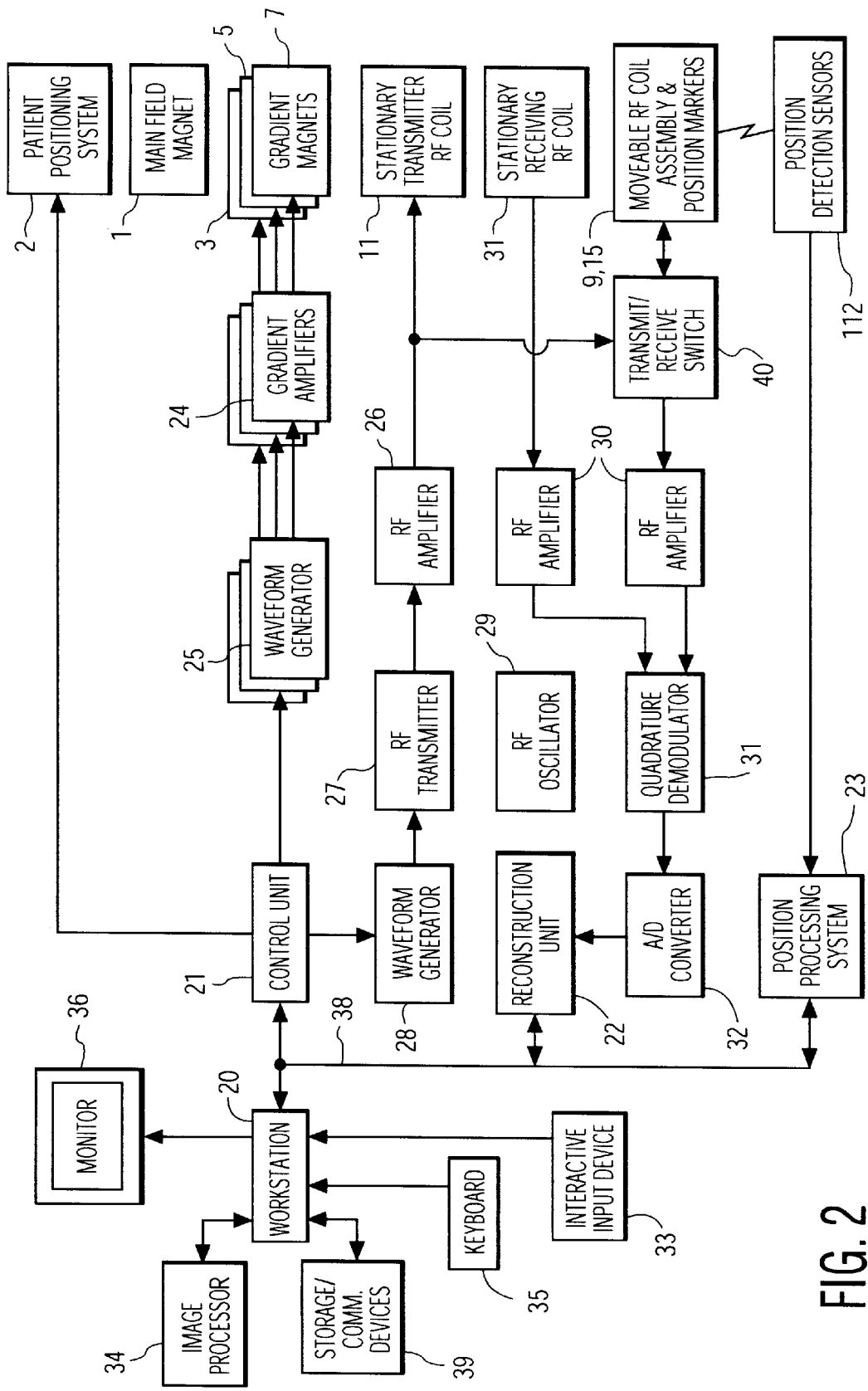
FIG. 2 illustrates a functional diagram of an exemplary embodiment of the present invention.

Next, FIG. 2 illustrates an exemplary functional block diagram of control and processing units of the MR apparatus illustrated in FIG. 1, which is adapted for use with a moveable RF coil assembly of the present invention. Main field magnet 1 can be separately controlled and aligned to generate a steady magnetic field along the Z-axis of a strength, for example, of from 0.5 to 1.5 Tesla, and sufficiently homogenous in a homogeneity volume centered on the coordinate origin in FIG. 1.

The magnetic field gradient system includes: magnet coils 7, 5, and 3 capable of generating magnetic gradient fields $G_x$, $G_y$ and $G_z$ which extend along the Z-direction and have a gradients along the X-, the Y-, or the Z-axes, respectively, three gradient amplifiers 24, and three waveform generators 25. In operation, control unit 21 loads data describing determined envelopes of the time-behavior of the three gradient fields into waveform generators 25, which on command generate waveforms describing the determined time-behavior. These waveforms are amplified by gradient amplifiers 24 to drive the gradient magnet coils 3, 5, and 7.

Nuclear magnetization in the examination zone is excited by RF pulses from an RF transmitter system, which includes: RF amplifier 26, RF transmitter 27, waveform generator 28, and RF oscillator 29. In operation, control unit 21 loads data describing a determined time-dependent RF waveform envelope into waveform generator 28. On command, the RF transmitter then combines the determined waveform envelope with the output of RF oscillator 29, which is a carrier with a frequency corresponding to the $^1H$ Larmor frequency (approximately 63 MHZ in the case of a main field of 1.5 T), to generate an RF signal. The RF signal is then amplified by RF amplifier 26 to drive an RF transmitter coil to radiate RF pulses for exciting the nuclear magnetization.

The RF transmitter coil can be a conventional stationary RF transmitter coil, such as coil 11. Preferably, however, the moveable RF coil is used to transmit RF pulses, as well as to receive MR signals. In this case, the moveable RF coil is switched by transmit/receive switch 40 from connection to input RF amplifier 30 to output RF amplifier 26. In alternative embodiments, the moveable RF coil assembly can include a separate RF receiver coil and a separate RF transmitter coil. Then the transmit/receive switch is not needed, although different means to protect input RF amplifier 30 from signals induced by the transmitter coil are still desirable.

MR signals generated from an object in the examination zone are picked up by receiving coils and processed by the RF receiver system, including RF amplifiers 30, quadrature demodulator 31 and A/D (analog-to-digital) converter 32. RF receiving coils include, optionally, conventional stationary RF receiving coil, but preferably the moveable RF coil of the present invention. For reception, where RF coil assembly 9 includes a single RF coil, transmit/receive switch 40 connects this single RF coil to input RF amplifiers 30. Quadrature demodulator 31 demodulates the received and amplified MR signal with reference to two 90° offset carrier oscillations supplied by RF oscillator 29, so that two signals are generated which may be considered as the real part and the imaginary part of a complex MR signal. On command by control unit 21, the demodulated signals are applied to A/D converter 32, which forms digital MR data therefrom. The digital MR data are stored in reconstruction unit 22 which reconstructs, in cooperation with workstation 20, MR images representing the nuclear magnetization excited in an object being examined.

An MR apparatus for use with the present invention also includes a position detection system for the determining the 3D position and 3D orientation of moveable RF coil assembly, and especially of the moveable RF coil holder 9. The position detection system is illustrated in FIG. 2 as including position detection sensors 112, which interact over an interaction field with moveable RF coil assembly 9 to provide position data signals. In various embodiments, the interaction field may be optical, or ultrasonic, or electromagnetic, or so forth. The position detection system also includes position processing system 23, which determines 3D position and 3D orientation from the position data signals. In other embodiments, the position detection sensors and processing system may be combined with other elements already illustrated or may include further intermediate components not illustrated.

For example, in case of the exemplary optically-based position detection system illustrated in FIG. 1, position detection sensors 112 include a camera unit for stereoscopically imaging optical markers 15, such as the LEDs. Then position pricess system 23 performs known geometric transformations needed to determine the spatial 3D coordinates of the light sources from the stereoscopic images and to determine the 3D position and 3D orientation of the moveable RF coil from the determined spatial coordinates of the light sources. Here, the position processing may be alternatively performed by other illustrated components, such as workstation 20.

In a further embodiment, the position-detection system uses MR-active microcoil sensors. Such a position detection system is known from, e.g., U.S. Pat. Nos. 5,271,400 and 5,318,025. Preferably, at least three MR-active microcoils, mounted on the moveable RF coil assembly, are designed to receive MR signals from an enclosed MR active media, such as a gadolinium-doped aqueous media. 3D spatial coordinates of the microcoils can be determined from the central frequency in the Fourier transform of the MR signals received from the microcoils which are generated in the presence of linear gradients along the X-, Y-, and Z-axes in the main magnetic field after excitation of nuclear magnetization in the MR active media in the microcoils. The 3D position and 3D orientation of the moveable RF coil can then be determined from the microcoil coordinates in a similar manner to the optically-based system.

In this embodiment, position processing system 23 preferably includes an RF amplifier, a quadrature demodulator, an A/D converter, and a Fourier transform unit for processing the microcoil signals. Alternatively, the microcoil signals can be processed by the existing quadrature demodulator 31, A/D converter 32, and reconstruction unit 22.

In an alternative position detection system, markers 15 emit ultrasound pulses of sufficient frequencies so that the individual 3D positions of each marker can be adequately localized by the times of flight measured to three or more ultrasound receivers. The receivers are non-collinearly positioned and arranged to receive ultrasound signals from the main-field magnet homogeneity volume. The 3D position and 3D orientation of the moveable RF coil is, as above, determined from the 3D positions of the markers. Such an ultrasound based position detection system is also capable of continuously monitoring the 3D position and 3D orientation of the moveable RF coil. Alternative position detection systems are subsequently described.

Referring again to FIG. 2, the MR apparatus also preferably includes a patient positioning system for moving the patient to be examined so that the regions of interest are present in the homogeneity volume of the main-field and gradient-system magnets. In an exemplary embodiment, this system includes a motor and drive unit 2 which is coupled to patient table 4 and is controlled by control unit 21 in response to commands from workstation 20. Thereby, the patient can be automatically positioned correctly with respect to the MR magnets.

Finally, an MR apparatus according to the present invention includes a control means for controlling the functional components of the MR apparatus to generate MR image data, to process received data, to reconstruct MR images, and to perform necessary associated computation according to the methods of this invention. In the exemplary embodiment illustrated in FIG. 1 the control means includes workstation 20 in cooperation with control unit 21, reconstruction unit 22, and position processing system 23.

Workstation 20 includes keyboard 35 and interactive input unit 33, for example a light pen or a "mouse", for entry of operator commands and queries. Device 39, which represents fixed and removable storage devices as well as optional communication links, stores data and programs and exchanges the same with other computer systems. Reconstructed images can be displayed on monitor 36, perhaps after image enhancement or other image processing by optional image processor 34. As described subsequently, images can also be displayed to medical personal in real-time in the vicinity of the moveable RF coil assembly, for example on an LCD display mounted on the moveable RF coil assembly.

Although the control means is illustrated here as implemented by the separate and partially specialized elements 20–23, it will be apparent that these control means can be routinely implemented in many equivalent manners. For example, all control and processing functions can be implemented by a single sufficiently powerful workstation and attached interface hardware. Such a workstation, in response to memory-resident program instructions, can control the remaining functional elements according to the methods of this invention through the interface hardware, can reconstruct resulting MR images, can display the reconstructed, and so forth. This invention includes such routinely-known alternative distributions of control and processing function.

Because most implementations of such a control means will include programmable elements, the methods of this invention can be implemented as a program or programs having instructions, which, when resident in the memories of the programmable elements, command the performance of the present methods.

Accordingly, this invention further includes these programs and also carrier media on which these programs are impressed. Such carrier media can include (removable) magnetic or optical media which can be read by storage device 39, or transmission over attached communication links.

In an alternative embodiment (not illustrated), the moveable RF coil is coupled to a robot manipulator, such as a robot arm, for manipulation and moving the moveable coil assembly. Such an arm, as known in the art, can consist of a base on which is mounted a segmented arm, pairs of adjacent segment being coupled for controlled relative angular movement. The moveable RF coil is coupled to a terminal segment. The 3D position and 3D orientation of the arm can be controlled by a robot controller by commanding relative motion of the joint segments. A user can control the arm by entering commands directly at the robot controller or at workstation 20 for transfer to the robot controller, perhaps via control unit 21. Use of a robot arm is advantageous to exclude artifacts due to unwanted, badly timed, or inexact movements of the device during imaging.

In such an embodiment, the robot arm can be commanded to position the moveable RF coil assembly sequentially at a plurality of positions in a large region to be imaged. Guided by the measured 3D position and 3D orientation of the moveable RF coil assembly, the MR apparatus would then reconstruct sub-images at these plurality of positions. These separate sub-images can then be assembled into a composite final image by the workstation, perhaps in cooperation with image processor 34.

The Moveable RF Coil Assembly of the Present Invention

The moveable RF coil assembly of the present invention generally includes an RF coil holder, position detection means, and manipulation means. In general, the RF coil holder holds one or more RF coils for receiving or for transmitting RF signals. The manipulation means are for moving and positioning the RF coil holder. The RF coil assembly also can include separate position detection means, where required by a particular embodiment of the position detection system. Preferably, the moveable RF coil assembly also includes control means and display means.

Using the control means, an operator can enter control parameters for controlling the functioning of the MR apparatus. The operator can view displays, such as MR images, on the display means. The control and display means are preferably in sufficient proximity to the moveable RF coil holder that the operator can use these means while controlling or manipulating the RF coil assembly in the vicinity of and in proximity to a patient in the MR apparatus. These latter means provide for dramatically improved operator ease-of-use and interactivity.

Figure 3A:
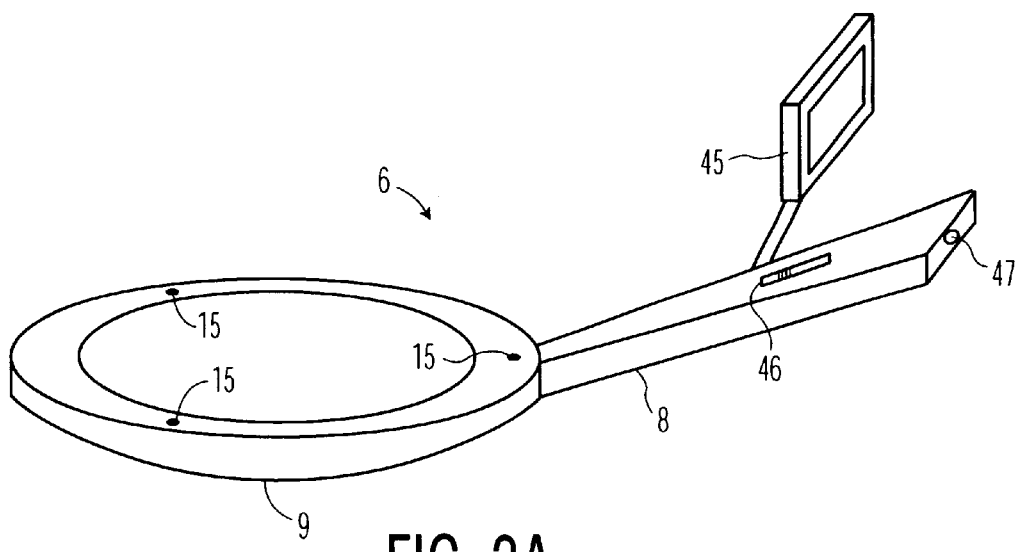
FIGS. 3A–C illustrate details of various embodiments of a moveable RF coil assembly according to the present invention.
Figure 3B:
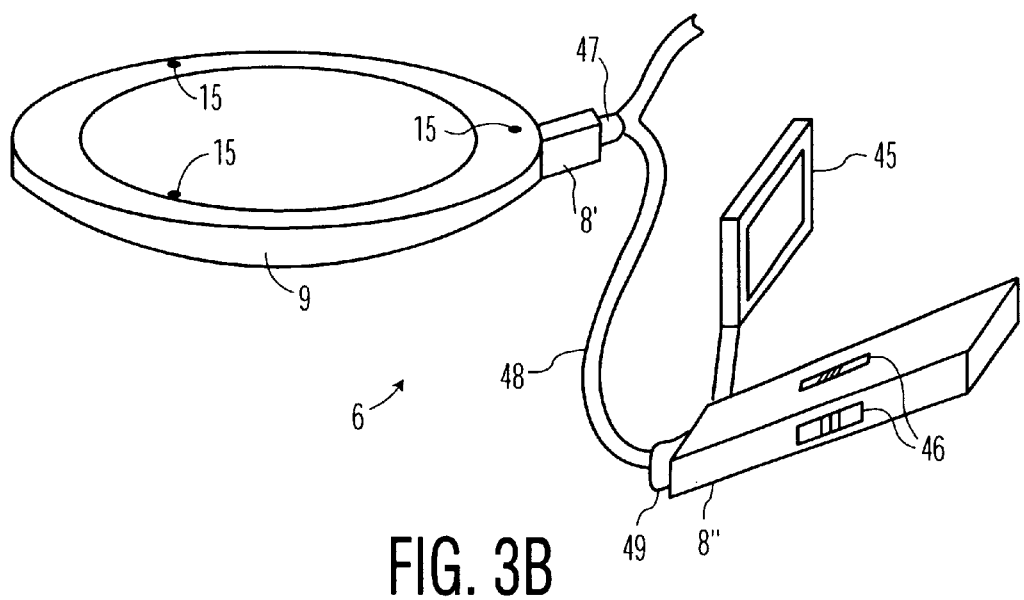
Figure 3C:
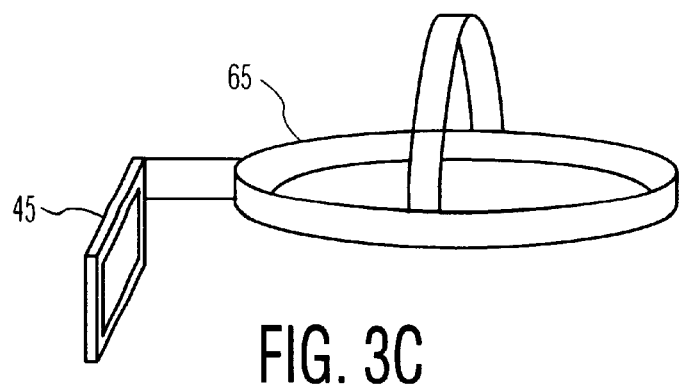

FIGS. 3A–C illustrate details of preferred embodiments of the moveable RF coil assembly of the present invention. Turning first to FIG. 3A, illustrated therein is an exemplary preferred embodiment of moveable RF coil assembly 6 for manual operator positioning adjacent to a region of interest in a patient. Here, the manipulation means is configured as handle 8 supporting substantially planar coil holder 9. The handle is configured and dimensioned to provide for reliable manual operator grasping and manipulation of the RF coil assembly. The hand held coil can then be positioned by the operator near a region of interest.

The manipulation means may also contain such passive or active components as are routinely necessary to tune and match the RF coils for signal transfer with the MR apparatus across a signal cable. A signal cable attaches at connector 47 for transferring signals between the MR apparatus and the RF coil or coils, the handle-mounted control means, the handle-mounted display, signals or sensors of the position detection system, and so forth.

Coil holder 9 carries the RF coil or coils and associated components, for example, tuning capacitors, matching capacitors, or switching diodes, as known in the art. Specifically, the RF coil can be a surface-type coil of a known structure suitable for transmitting RF pulses and for receiving MR signals. Alternately, separate coils can be provided for transmitting and for receiving. Less preferably, the RF coil may be for receiving only. The RF coil and RF coil holder are preferably shaped and dimensioned according to the region to be imaged. For example, the shape can be chosen to adapt to the surface of the region to be imaged, and the size can be just sufficient to transmit RF pulses to and to receive MR signals from the region to be imaged with a superior signal-to-noise (S/N) ratio, that is a S/N ratio superior to fixed body coils that may be present in the MR apparatus. As is known, the lateral extent of such an RF coil is approximately the same as the depth of the region to be imaged.

Next, where the position detection system requires separate elements for generating or sensing position detection signals, these separate elements are advantageously mounted on RF coil holder 9, or elsewhere on RF coil assembly 6. For example, separate elements 15 can be LEDs with characteristic emissions for an optically-based position detection system, or MR-active microcoils mounted in the RF coil holder for a microcoil-based system, or ultrasound transducers for an ultrasound-based system, or so forth.

Preferably, handle 8 also includes handle-mounted control means, which are represented schematically in FIG. 3A by thumb-slider 46, slidable either to set a continuous value for a parameter or to select one of several discrete parameter values. Other ergonomically appropriate control means can be also provided in the handle for separate entry of additional parameters. Also, one control means can be multiplexed to input several different parameters.

The entered parameters are preferably for controlling the MR apparatus. For example, entered parameters advantageously relate to contrast-relevant aspects of the MR imaging protocols, such as, type of imaging protocol, pulse repetition rate, echo time, excitation flip angle, pulse delays, and so forth. Other entered parameters can relate to geometrically-relevant aspects of imaging, such as, for example, the 3D orientation and 3D position of an imaged slice relative to the RF coil, the 3D position and 3D orientation of an imaged volume relative to the RF coil, size of the field of view, and so forth. Such handle-mounted control means can also control initiation and cessation of MR signal generation for the selected imaging protocol. In fact, any parameter requiring operator attention during imaging can be controlled by handle-mounted control means.

Also preferable is a conveniently-sized local MR display, such as LCD 45, which can be mounted on the RF coil assembly itself, for example on the handle of the assembly. This display can present MR images for immediate operator viewing in real-time, or even during the process of their reconstruction. Display variables, such as image contrast and brightness, can be controlled by additional control means provided on handle 8 or directly on LCD display 45. In addition to images, handle-mounted display 45 can also monitor entry of parameters by the handle-mounted control means, present status information about the MR apparatus, display the progress of current imaging protocol, and so forth Such a local display frees an operator from having to move in order to concentrate simultaneously or alternately on the exact position of the RF coil assembly in the patient's proximity and on the MR image being reconstructed presented on an external and possible distant display.

The combination of the local display and control means provides an operator with highly interactive control of an MR apparatus. The moveable RF coil assembly can be used just like a magnifying glass, being placed near the region to be imaged and being "focused" via the control means to acquire images from an adjustable depth and position in the region to be imaged, the acquired images being displayed on the local display means in real time.

In an alternative preferred embodiment, the manipulation means is adapted for coupling to robotic manipulators or surgical manipulators, as known in the art. FIG. 3B illustrates this embodiment, which as in the previous embodiment also includes RF coil holder 9 with position detection markers 15. Here, however, the manipulation means includes coupling portion 8', which is specifically adapted to coupling to a mechanical manipulator (not illustrated), such as a robot arm, as well as manual portion 8", which is specifically adapted for operator use. Accordingly, the manual portion includes exemplary mounted control means 46 and mounted local display 45, both therefore in proximity to an operator. The two portions of the manipulation means are electrically interconnected by signal cable 48 which links coupler 47 on portion 8', coupler 49 on portion 8", and the MR apparatus.

In another preferred embodiment, the local display means can be arranged in proximity to an operator in different manners. For example, it can be physically integrated with or mounted on the coil assembly in convenient manners other than those illustrated. Additionally, the local display can be provided by various "heads-up"-type displays used in other applications, such as are known in the arts of aircraft cockpit design. FIG. 3C illustrates an exemplary such heads-up display, which includes adjustable harness 65 for snugly fitting to an operator's head and for supporting LCD display 45 just to the side of the operator's line of direct vision. The local display can also be attached to the MR apparatus itself or on a conveniently positionable cart or holder.

Finally, the RF coil assembly of this invention is adaptable to position detection systems other than the optically-based, or microcoil-based, or ultrasound-based systems already described. For example, position detection systems based on other principles have been developed in recent years to assist surgical interventions, where they accurately determine the position and orientation of a surgical instrument. Where suitable for use in the MR environment, such systems can be used to determine the 3D position and 3D orientation of the moveable RF coil assembly of this invention.

For example, the 3D position and 3D orientation of the moveable RF coil assembly may be determined entirely from received MR signals. In one such alternative, nuclear magnetization in thin slices near the moveable RF coil is excited; MR image signals are received from the slices with the moveable RF coil; and the current spatial distribution of the sensitivity profile of the moveable RF coil is determined from the received MR image signals. Then, using the known reference sensitivity profile of the moveable RF coil (determined either from electromagnetic theory or from experimental measurement), the RF coil's current 3D position and 3D orientation can be determined. Preferably, three orthogonal slices near the last known position of the moveable RF coil are excited. The current spatial sensitivity profile can be more accurately determined by the additional acquisition and comparison of low-resolution volume images acquired by means of both the moveable RF coil and also a stationary whole body coil present in the MR apparatus.

In another similar alternative, the surface coil can be localized by image registration. An actual, preferably, low-resolution, MR volume image is obtained by means of the moveable RF coil, and is registered by routine image registration techniques, such as a cross-correlation calculation, in an overall larger volume image previously obtained by MR measurement using, preferably, a stationary whole body coil present in the MR apparatus. By such image registration the current 3D position and 3D orientation of the moveable RF coil can also be determined.

Where the position detection system functions in the interior of a patient, the RF coil assembly itself can be adapted for use in the interior of the patient.

The Methods of the Present Invention

Figure 4:
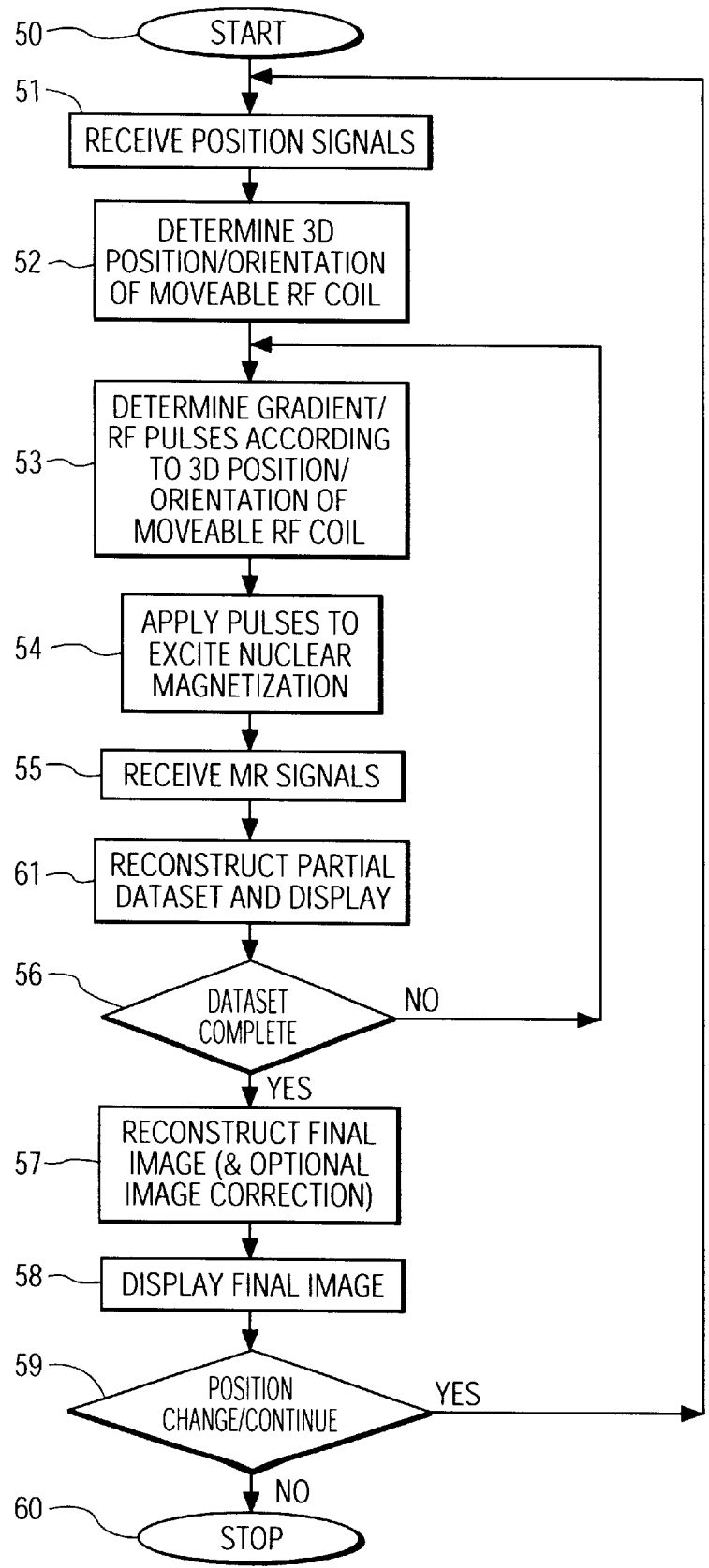
FIG. 4 illustrates an embodiment of a method according to the present invention.

Having described above the apparatus and devices of the present invention, next, with reference to FIG. 4, methods of their use are set forth below. Generally, according to the methods of the present invention, first, the 3D position and 3D orientation of the moveable RF coil are determined from the position detection system, and, second, nuclear magnetization is excited in the current 3D vicinity of the moveable RF coil by magnetic gradient and RF pulse sequences selected in view of the current 3D position and 3D orientation. Finally, an MR image is reconstructed from the signals received from the moveable RF coil. Reconstructed final MR images are displayed to the operator as soon as possible, preferably in real-time. Preferably, sliding-window reconstruction is performed during image dataset acquisition so that the operator can view partial images as soon as possible. Accordingly, the operator is able to guide the MR examination in a highly interactive fashion, thereby focusing on obtaining high quality images of the anatomic regions of greatest current interest.

Importantly, movement of the moveable RF coil by the operator is preferably sufficiently slow compared to the imaging pulse sequences so that conventional image reconstruction techniques can be used without excessive motion blurring. Optionally, operator feedback provided by means of the local LCD display, by means of an audible indication, or by other means can assist the operator in correct use and movement of the moveable RF coil assembly during imaging.

In detail, the methods of the present invention start at start step 50 (of FIG. 4), perhaps after receipt of an operator start command. Then, at steps 51 and 52 the position detection system receives position signals and determines the current 3D position and 3D orientation of the moveable RF coil. Preferably, three spatial coordinates of three non-collinear markers on the moveable RF coil assembly are determined. This permits full determination of the 3D position and 3D orientation of a substantially planar RF coil assembly as the position of the coil assembly and the orientation of the plane of the RF coil assembly.

The exact nature of these steps depends on the position detection system. For example, in the case of optically-based systems, 3D position and 3D orientation may be determined almost continuously from the coordinates of three optically-identifiable markers on the moveable RF coil assembly, these 3D coordinates being determined from stereoscopic images of the moveable RF coil assembly. In the case of MR-active microcoil-based systems, the coordinates of microcoils in the moveable RF coil assembly are determined from MR signals received from the microcoils when exposed to linear magnetic field gradients along each coordinate direction. MR data from the microcoils is periodically generated by special pulse sequences in order to track the microcoil. See, e.g., U.S. Pat. Nos. 5,271,400 and 5,318,025.

In case the moveable RF coil's 3D position and 3D orientation are determined from image registration, these steps include periodic determination of a, preferably, low resolution image from signals received by the moveable RF coil according to any known rapid scan protocol, and its registration with a previously determined low-resolution 3-D image of the entire region of interest of the patient. Image registration can be based on, for example, a cross-correlation calculation. Finally, where the moveable RF coil's 3D position and 3D orientation are determined from its known sensitivity profile, M image data from preferably orthogonal slices adjacent to an expected position of the moveable RF coil are obtained from the RF coil. From this image data and from the known spatial sensitivity profile of the moveable RF coil, the current 3D location and 3D orientation of the moveable RF coil can be routinely determined. The spatial sensitivity profile of the moveable RF coil can be routinely determined either from magnetic field modeling or from MR measurements using the RF coil with a known phantom.

Next, at step 53, the magnetic field gradient and RF pulses defining the 2D slice or the 3D volume to be imaged are determined from the current 3D position and 3D orientation of the moveable RF coil. The imaged slice or volume can be readily displaced along with the 3D position and 3D orientation of the moveable RF coil simply by changing these gradient and RF pulses.

In a typical application of the present invention, the operator selects a region (slice or volume) to be imaged with respect to the moveable RF coil. For example, a slice or volume to be imaged is selected to have a certain relative 3D displacement and a certain relative 3D orientation with respect to the moveable RF coil. A linear image of an essentially one-dimensional (1D) cylindrical volume can be similarly selected to have a certain 3D orientation and 3D displacement with respect to the moveable RF coil. Optionally, the region to be imaged can be selected based on parameters input by the operator control means mounted on the moveable RF coil assembly.

Preferably, the selected region is in or intersects the spatial sensitivity profile of the moveable RF coil so that this coil can transmit RF pulses to and receive MR signals from the selected region with a superior S/N. Alternatively, the operator may select a region not intersecting the sensitivity profile of the moveable RF coil, in which case MR signals can be received by another stationary RF receiving coil present in the MR apparatus. In this latter alternative, the moveable RF coil assembly functions primarily as a pointer by which the operator directs the MR apparatus to the imaged region.

In another application, the MR apparatus can be directed simply to image the slice or volume where the moveable RF coil has the greatest sensitivity.

In any case, the 3D position and 3D orientation of the moveable RF coil determines the 3D position and 3D orientation of the region (1D, 2D, or 3D) to be imaged. Given this region, the methods of this invention are compatible with a wide variety of known and novel imaging protocols. Preferably, imaging protocols are rapid in order that the operator can slowly move the moveable RF coil during imaging without appreciable blurring. Several exemplary imaging sequence are described herein. In the following, $G_U$ and $G_V$ are taken to be magnetic gradient fields in perpendicular directions laying in a defined plane, while $G_W$ is taken to be the magnetic gradient field in a direction perpendicular to the defined plane. Since the U-V-W coordinate system (fixed relative to the region to be imaged) is generally oblique with respect to the X-Y-Z coordinate system (conventionally fixed in MR apparatus), generation of these gradient fields is routinely achieved by applying a linear combination of the gradient fields $G_X$, $G_Y$, and $G_Z$ determined by the linear transformation between the X-Y-Z coordinate system and the U-V-W coordinate system.

In one exemplary imaging protocol, the moveable RF coil is used in a manner similar to ultrasound imaging in the M-mode or the B-mode. Here, nuclear magnetization in a thin, substantially 1D, cylindrical volume is excited by the moveable RF coil, and measuring data is measured from the cylinder by the moveable RF coil. Preferably, the cylindrical volume is selected to be along the 3D axis of maximum sensitivity of the sensitivity profile of the moveable RF coil, which is generally centered with respect to and perpendicular to the 3D plane of the moveable RF coil. Alternatively, the 3D position and 3D orientation of the cylindrical column is controlled by the operator, perhaps using manual control means mounted on the moveable RF coil assembly. The reconstructed linear image is then immediately displayed, possibly side-by-side along with previous linear images. When the moveable RF coil is held fixed with respect to the patient, the resulting total display provides information about the time variation in the fixed cylindrical volume. Alternatively, a 2-D image is provided when the moveable RF coil is scanned across the patient.

Figure 5:
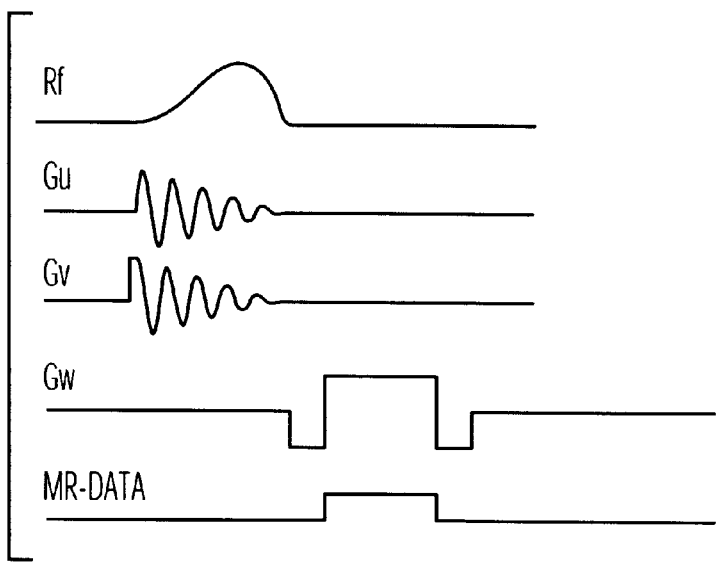
FIG. 5 illustrates an exemplary one-dimensional imaging sequence useable in the present invention.

FIG. 5 illustrates an exemplary MR sequence for this alternative. This sequence includes first of all a two-dimensional RF pulse (first line) which excites the nuclear magnetization in a thin cylindrical volume in temporal cooperation with two oscillating magnetic gradient fields $G_U$ and $G_V$ (second and third lines). Here, the U and V coordinates are orthogonal coordinates in a plane transverse to the selected cylindrical volume, preferably parallel to the currently determined 3D plane of the moveable RF coil. In this excited cylindrical region, an MR signal is generated by a read gradient $G_W$, which is in a direction perpendicular to the U-V plane (fourth line), and is read (fifth line). A 1D image of the nuclear magnetization in the excited cylindrical volume is reconstructed from the MR signal received from the moveable RF coil by inverse Fourier transformation.

In another alternative, a 2D slice image, or multiple 2D slice images, are obtained of slices with a selected 3D position and 3D orientation with respect to the moveable RF coil. Preferably, these slices are within the spatial sensitivity profile of this coil so that the RF pulses can be transmitted to and MR imaging signals can be received from theses slices with the moveable RF coil; more preferably these slices are parallel to the current 3D plane of the RF coil. Many high-speed slice imaging techniques can be used in this alternative, including, for example, techniques based on multiple spin-echo imaging, such as RARE (rapid acquisition with relaxation enhancement; U.S. Pat. No. 4,818,940) or on multiple gradient-echo imaging, such as high-speed FLASH (fast low-angle shot) or EPI (echo-planar imaging).

Figure 6:
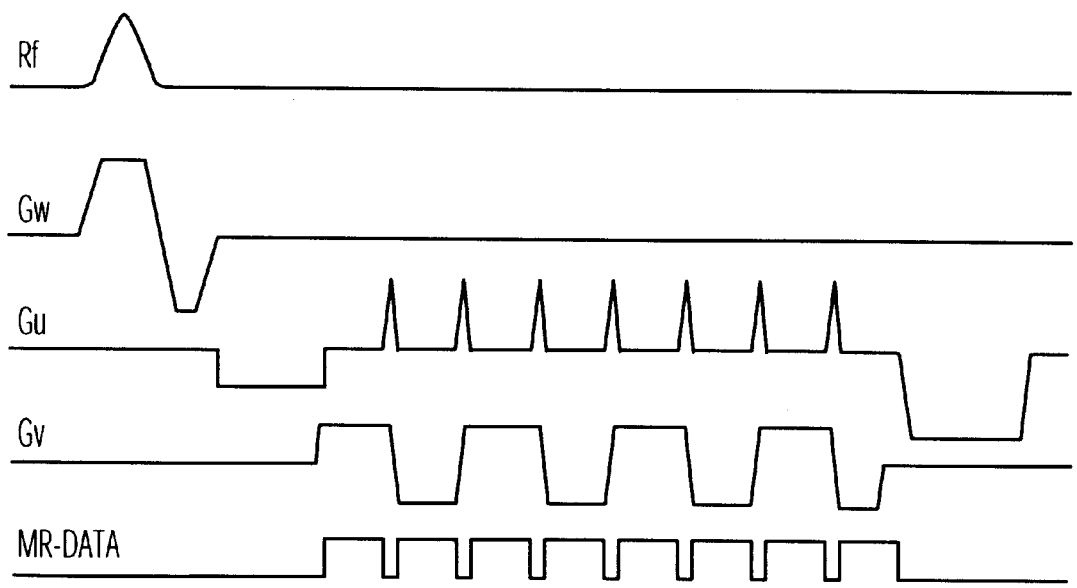
FIG. 6 illustrates an exemplary two-dimensional imaging sequence useable in the present invention.

FIG. 6 illustrates, for a modulus blipped EPI single-pulse protocol, the temporal variation of the RF pulse (first line), the gradient field $G_W$ for slice selection (second line), the gradient field $G_U$ for phase encoding (third line), the gradient field $G_V$ for read-out (fourth line), and the MR signal (fifth line). The slice selection gradient, $G_W$, is perpendicular to plane of the selected slices, preferably perpendicular to the current 3D plane of the moveable RF coil. The phase encoding and read-out gradients are perpendicular gradients in the plane of the selected slices.

Subsequent to the slice-selective RF pulse and slice selection gradient, the phase encoding gradient, $G_U$, is switched on and off in such a manner that the maximum phase encoding is reached in k-space. Subsequently, the read-out gradient $G_V$ with a continuously alternating polarity is switched on, each polarity reversal being accompanied by a brief "blip" of the phase encoding gradient, $G_U$, so that subsequent thereto a neighboring line in the k-space is scanned, and each time a respective MR signal is acquired. After the last polarity reversal, the phase encoding gradient is activated with a polarity which opposes that of the blips and with a time integral such that in k-space the same point is reached as before the start of the sequence.

The temporal distance between the last repeat of the read-out cycle and the next RF pulse is limited by dephasing due to magnetic field inhomogeneities and the like. In order to reduce such dephasing, it is possible to generate, after each excitation cycle, a 180° RF pulse to refocus the nuclear magnetization in the previously excited volume.

Several modifications and extensions of these high-speed imaging techniques can be advantageously employed in the present invention. First, two-dimensional excitation pulses can be used to select a local slice with reduced lateral extent in order to avoid aliasing artefacts or to enhance the speed of the measurement. In this case, since only a strictly local volume generates RF signals to be measured, this volume can be measured in k-space with a comparatively small number of sample points without aliasing, thus enabling the use of very fast MR sequences. Second, as is routinely known, the center of k-space can be preferentially scanned or oversampled in order to obtain, first, the contrast important signals. For similar reasons, instead of linear scanning of k-space, spiral scanning or various other types of k-space scanning strategies can be used.

By varying imaging sequence parameters, the relative 3D position and 3D orientation of the selected slices or selected volume can be changed. For example, by varying the directions of the phase encoding and read-out gradients, the angular orientation of the imaged slices can be chosen.

Manual control means mounted on the moveable RF coil assembly can be used to select these directions without rotation of the coil itself. Thereby, an operator can scan a slice or volume of interest in an angular or other manner by use of the manual control means alone. Additional manual control means can be used to select the depth of the imaged volume.

Returning now to FIG. 4, after magnetic gradient and RF pulses appropriate to a selected imaging sequence and the selected volume to be imaged are determined in step 53 in view of the current 3D position and 3D orientation of the moveable RF coil, at step 54, control signals are generated which cause the MR apparatus to apply these pulses to the object being examined. Preferably, RF pulses are transmitted from the transmit/receive coil (or the transmit only coil) in the moveable RF coil assembly. At step 55, MR signals are received from the moveable RF coil, or from other stationary RF receiving coils in the MR apparatus, at the appropriate time in the pulse sequence.

Step 56 tests whether a complete dataset has been collected for the selected imaging technique. For example, in the case where linear images are reconstructed, every MR signal defines a complete dataset. In the case of planar imaging, data for at least the center of k-space must be accumulated before image reconstruction can begin. Preferably, along with image reconstruction based on a complete dataset at step 57, optional step 61 reconstructs an image from a partial dataset during its acquisition and displays this partial image. For example, a known sliding-window reconstruction can be used to carry out this step. Accordingly, the operator can be presented with nearly instantaneous feedback on the quality of the ultimate image.

When a sufficiently complete dataset has been received, at step 57 the MR image is reconstructed by techniques standard for the selected imaging sequence, and is displayed at step 58. As explained, preferably, this display includes a display easily visible to the operator of the moveable RF coil assembly so that the motion of the moveable RF coil can be controlled to obtain images of increased value.

Further, as part of reconstruction step 57, it is preferable to correct the reconstructed image for the known sensitivity profile of the moveable RF coil. Because an RF coil configured as a surface coil has a greater signal sensitivity nearer to the coil than further from the coil, tissue voxels nearer to the coil will be seen to have greater nuclear magnetization than tissue voxels further from the coil. Since the relative 3D position and 3D orientation of the region imaged relative to the moveable RF coil is determined and known, this sensitivity artifact can be corrected most simply by dividing the reconstructed received image by the spatial sensitivity profile of the RF coil. Other methods of correction are known in the art can also be applied. See, e.g., Ross et al., 1997, NMR in Biomedicine 10:125–128.

After image reconstruction, step 59 tests whether to continue the MR examination, and, if so, whether a new position of the moveable RF coil should be determined. Periodic position determination is performed so that the position of the moveable RF coil is known with sufficient accuracy to generate correct imaging sequences.

In an optional last step (not illustrated), after the region of interest in a patient has been determined, a conventional MR examination procedure with conventional stationary RF receiving coils can be performed to further examine the interactively determined region of interest.

Also optionally, where a region to be imaged is larger than the sensitivity profile of the moveable RF coil, the moveable RF coil can be positioned near portions of the region to be imaged and sub-images formed of each such portion. Advantageously, the portion and their sub-images cover the region to be imaged, and they can then be registered and combined into a composite single image of the entire region to be imaged. Image registration and combination can be performed by methods known in the art, such as by a cross-correlation for registration and of modulus addition for combination. Accordingly, the method illustrated in FIG. 4 is performed for each sub-image and the resulting sub-images then combined.

Where the moveable RF coil is manipulated and moved by a robot arm, RF coil placement and sub-images reconstruction can be coordinated by commands to the robot control unit and to the MR apparatus.

In an advantageous alternative, the MR apparatus also tracks the current position of the moveable RF coil assembly with respect to the homogeneity volume of the main-field magnet and of the magnetic gradient field system. In case the operator moves the RF coil assembly out of these homogeneity volumes, the patient table is automatically commanded to move along in order to keep the region being imaged within these homogeneity volumes. The region being imaged is indicated by the 3D position and 3D orientation of the moveable RF coil assembly.

All references cited herein are incorporated herein by reference in their entirety and for all purposes to the same extent as if each individual publication or patent or patent application was specifically and individually indicated to be incorporated by reference in its entirety for all purposes.

What is claimed is:

1. A method for generating magnetic resonance (MR) images by an MR apparatus comprising:

positioning a moveable radio-frequency (RF) coil holder in proximity to an object to be examined, positioning the object so that a part of the object in proximity to the RF coil holder is positioned in a homogeneity volume of a main magnetic field of the MR apparatus;

determining a current 3D position and a current 3D orientation of the moveable RF coil holder, determining magnetic field gradient pulses and RF pulses for exciting nuclear magnetization in a region of interest with a 3D position and a 3D orientation located relative to the current 3D position and the current 3D orientation of the moveable RF coil holder, applying the determined magnetic field gradient pulses and RF pulses in order to excite nuclear magnetization in the determined region of interest, receiving RF imaging signals that are generated by the excited nuclear magnetization by an RF coil in the moveable RF coil holder, and reconstructing an MR image of the region of interest from the received RF imaging signals.

2. The method of claim 1 wherein the step of determining a current 3D position and current 3D orientation further comprises determining the spatial coordinates of three non-collinear markers on the moveable RF coil holder.

3. The method of claim 1 further comprising the step of displaying the reconstructed MR image on a display in proximity to the moveable RF coil holder.

4. The method of claim 1 wherein the determined RF pulses are transmitted by an RF coil in the RF coil holder.

5. The method of claim 1 wherein wherein the step of determining magnetic gradient field and RF pulses is responsive to a current position of the region of sensitivity of the RF coil in the RF coil holder, the current position of the region of sensitivity depending on the reference sensitivity profile of the RF coil and on the current 3D position and current 3D orientation of the moveable RF coil holder.

6. The method of claim 1 wherein the RF coil holder comprises control means for the entry of parameters, and wherein the step of determining magnetic gradient field and RF pulses is responsive to the parameters entered by the control means.

7. The method of claim 1 further comprising repetitively executing the steps of positioning, determining a position and an orientation, determining magnetic field and RF pulses, applying, receiving, and reconstructing in order to generate a plurality of MR images from a plurality of regions of interest.

8. The method of claim 1 wherein the moveable RF coil assembly is hand held, and wherein the RF coil assembly is manually positioned by an operator in proximity to the object.

9. The method of claim 1 wherein the moveable RF coil assembly is coupled to a mechanical manipulator, and wherein the mechanical manipulator is controlled by the operator to position the moveable RF coil holder in proximity to the object.

10. The method of claim 1 wherein the nuclear magnetization is excited in a cylinder with a longitudinal axis substantially perpendicular to a plane of the RF receiving coil holder, and wherein a one-dimensional MR image of the cylinder is reconstructed.

11. The method of claim 1 wherein the nuclear magnetization is excited in a slice with a adjustable position and orientation with respect to the current 3D position and current 3D orientation of the moveable RF receiving coil holder, and wherein a two-dimensional image of the region of the slice is reconstructed.

12. A computer readable media encoded with program instructions for causing a programmable control means of an MR apparatus to perform the method of claim 1.

13. An MR system for generating magnetic resonance (MR) images of a region of interest of an object to be examined comprising:

a main field magnet for generating a steady magnetic field in the region of interest, a magnetic field gradient system for generating temporary gradients in the steady magnetic field in the region of interest, a radio-frequency (RF) transmitter system for transmitting RF pulses to the region of interest, a moveable RF receiving coil assembly that includes (i) a moveable RF coil holder including an RF receiving coil for receiving RF imaging signals for reconstructing an MR image, (ii) means for providing position signals representative of a 3D position and a 3D orientation of the RF coil holder, (iii) means for displaying to the operator reconstructed MR images, and (iv) means for manipulating the moveable RF coil holder and the means for displaying, a position detection system for detecting the position signals, an RF receiver for receiving RF imaging signals from the RF receiver coil, control means responsive to the detected position signals for (i) controlling the position detection system to determine the current 3D position and the current 3D orientation of the moveable RF receiving coil holder, (ii) determining magnetic field gradient pulses and RF pulses for exciting nuclear magnetization in a region determined with respect to the current 3D position and the current 3D orientation of the moveable RF receiving coil holder, (iii) controlling the magnetic field gradient system and the RF transmitter system to apply the determined magnetic field gradient pulses and RF pulses in order to excite nuclear magnetization in the determined region, (iv) controlling the RF receiver to receive RF imaging signals generated by the excited nuclear magnetization, and (v) reconstructing an MR image of the region of interest from received MR imaging signals, and positioning means to position the object so that a part of the object in proximity to the RF coil holder is positioned in a homogeneity volume of the main magnets field.

14. The system of claim 13 wherein the control means further comprises memory means and processing means, and wherein the processing means are responsive to one or more programs resident in the memory means in order to perform the controlling.

15. The system of claim 13 wherein the moveable RF coil holder further includes an RF coil for transmitting RF pulses.

16. The system of claim 13 wherein the moveable RF coil assembly further comprises entry means for operator entry of parameters, and wherein the determining by the control means of magnetic gradient field and RF pulses is responsive to the parameters entered by control means.

* * * * *